United States Patent [19]

Wilcox

[11] 4,230,953
[45] Oct. 28, 1980

[54] NON-LINEAR CONTROL CIRCUIT

[75] Inventor: Milton E. Wilcox, San Jose, Calif.

[73] Assignee: National Semiconductor Corporation, Santa Clara, Calif.

[21] Appl. No.: 929,872

[22] Filed: Jul. 31, 1978

Related U.S. Application Data

[62] Division of Ser. No. 819,746, Jul. 28, 1977, Pat. No. 4,132,964.

[51] Int. Cl.³ .................. H03F 3/45; H03F 1/10; H03F 1/32
[52] U.S. Cl. .................. 307/230; 307/299 A; 330/252
[58] Field of Search .................. 307/230, 299 A; 330/252

[56] References Cited

U.S. PATENT DOCUMENTS

| 3,428,827 | 2/1969 | Berry | 307/230 X |
| 3,643,107 | 2/1972 | Gilbreath | 307/230 X |

Primary Examiner—John S. Heyman
Attorney, Agent, or Firm—Gail W. Woodward

[57] ABSTRACT

A low-Q mechanical resonator is operated in its series resonance mode in a circuit that includes an amplifier and voltage variable phase shifter. As the phase shift is varied, the resonator will shift its frequency to compensate the phase shift. The result is a voltage variable oscillator frequency. The low-Q resonator has a non-linear phase versus frequency characteristic so that frequency is not a linear function of control voltage. A plural emitter transistor is employed in one side of a non-linear differential control amplifier. The resulting non-linear transfer characteristic is used to compensate the non-linear oscillator characteristic so that the frequency versus control voltage is linear.

4 Claims, 4 Drawing Figures

U.S. Patent
Oct. 28, 1980
4,230,953
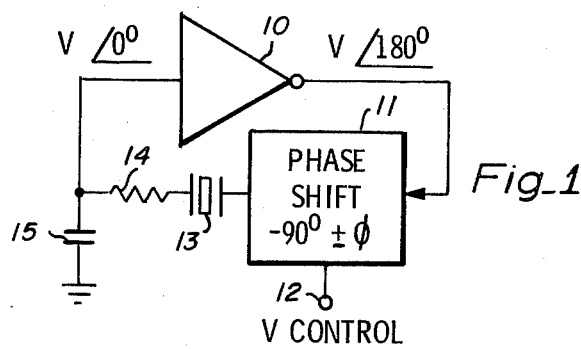
Fig_1
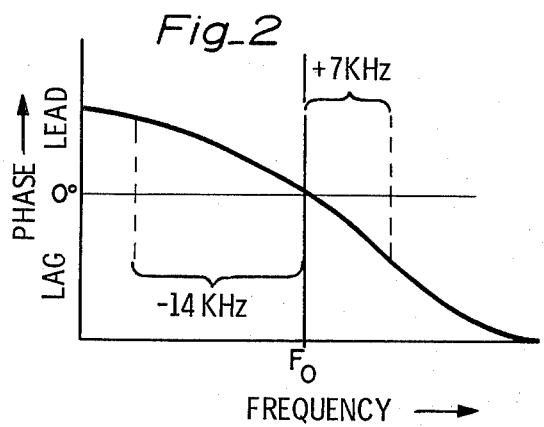
Fig_2
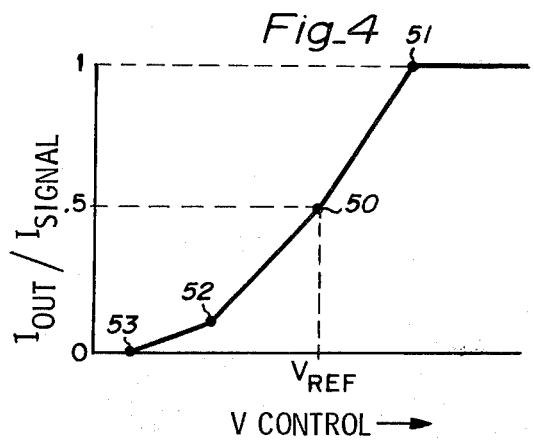
Fig_4
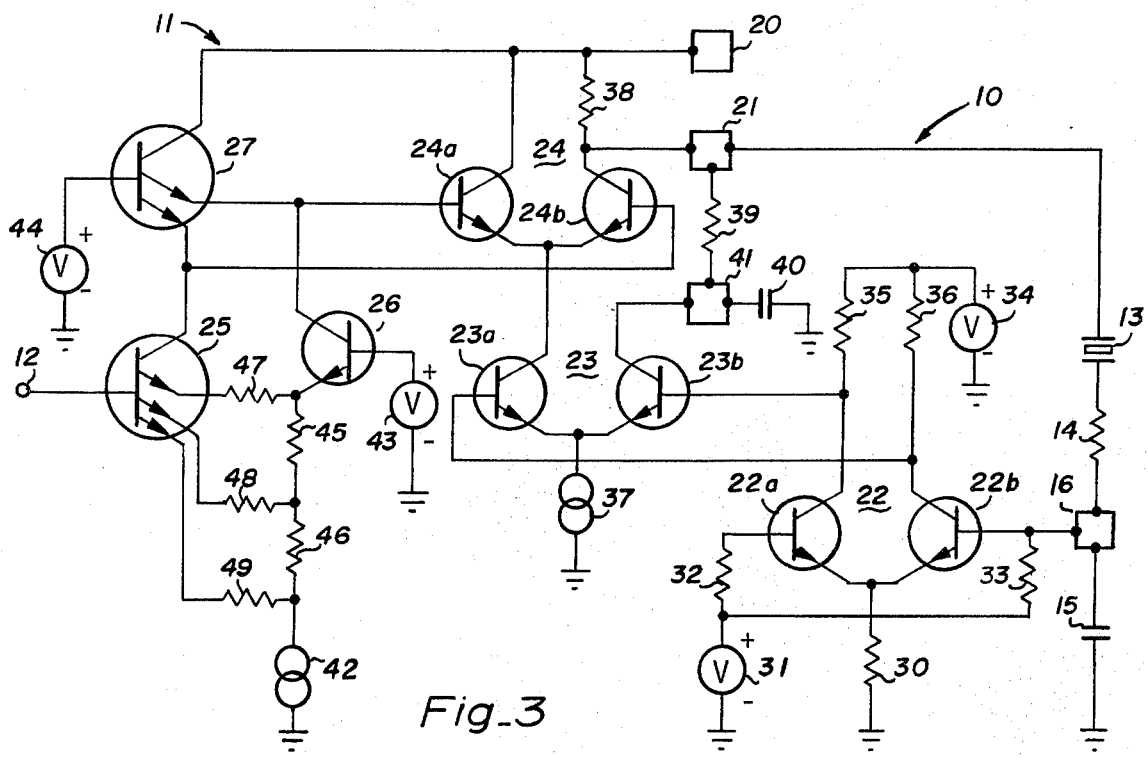
Fig_3

NON-LINEAR CONTROL CIRCUIT

This is a division of application Ser. No. 819,746 filed July 28, 1977 now U.S. Pat. No. 4,132,964.

BACKGROUND OF THE INVENTION

The invention relates to circuits employing mechanical resonators in voltage controlled oscillators. Mechanical resonators are often used because they are inherently stable and can be manufactured to relatively precise frequencies. Since such resonators are inherently stable, they are difficult to frequency modulate, particularly if a wide range of modulation is desired. In many cases it is desired to cause an oscillator to track a remotely produced signal. This is commonly done by a voltage control circuit which shifts the oscillator frequency to produce the desired tracking.

U.S. Pat. No. 3,973,221 shows a voltage controlled crystal oscillator of the kind used in the chrominance control in a color television system. The oscillator includes a ±45 degree voltage controlled phase modulator. With a balanced or reference input the phase shift is zero degrees and the crystal oscillator operates at is natural series resonance. As the control voltage varies the phase shift over the ±45 degree range, the crystal will oscillate at that frequency which causes it to introduce a phase shift of the opposite sign. Thus by means of a phase detector such an oscillator can be caused to operate in phase with the color television color burst.

The wide range of operation, ±45 degrees, means that the crystal operates over a substantial portion of its series resonant mode. Typically the phase shift versus frequency is greater on one side of resonance than it is for the other side of resonance. Accordingly, the control sensitivity in terms of frequency shift as a function of voltage is non-linear. While this characteristic is not a problem in many applications, it can have serious consequences in certain applications. For example, in a phase locked loop (PLL) the loop response to transients is a strong function of effective loop gain, which in turn is a function of oscillator voltage control sensitivity. In applications where transient response is important, a non-linear response produces excessive variations in transient response.

SUMMARY OF THE INVENTION

It is an object of the invention to provide a control circuit for a wide range voltage controlled oscillator that has a linear voltage versus frequency characteristic.

It is a further object of the invention to provide an integrated circuit which will operate in conjunction with a ceramic resonator to provide a linear frequency versus voltage response.

These and other objects are achieved in a circuit configured as follows. A mechanical resonator such as a ceramic resonator is coupled between the input and output of a non-inverting amplifier. The amplifier includes a voltage variable phase shifter that will operate over a ±45 degree range. The oscillator will operate at its zero phase shift series resonance and will vary in frequency as a function of control voltage to match the phase shift over the ±45 degree range. The control circuit includes a differential control amplifier which has a plural emitter device in one side. The plural emitters are differently biased so as to introduce a non-linear transfer characteristic. By suitably adjusting the non-linear transfer, the non-linear oscillator characteristic can be compensated so that the overall voltage versus frequency response is linear.

BRIEF DESCRIPTION OF THE DRAWING

FIG. 1 is block diagram of a wide range voltage controlled oscillator;

FIG. 2 is a graph showing the phase shift versus frequency characteristic of FIG. 1;

FIG. 3 is a schematic diagram of a voltage controlled oscillator having a linear voltage versus frequency chracteristic; and FIG. 4 is a graph showing the non-linear transfer function.

DESCRIPTION OF THE INVENTION

FIG. 1 shows a functional block diagram of a voltage controlled oscillator (VCO) using a mechanical resonator. Amplifier 10 has its output coupled to a variable phase shifter 11 which normally introduces a 90 -degree phase lag. The actual value of lag can be varied over $\pm \phi°$ (typically ±45 degrees) by means of a control voltage applied to terminal 12. Mechanical resonator 13 is operated in its series resonance mode. Resistor 14 is selected to be large relative to the resonator equivalent series resistance. Capacitor 15, in conjunction with resistor 14, introduces a nearly 90 degree phase lag between the resonator 13 and the input to amplifier 10. The selection of a lag network is important because it increases attenuation with frequency and avoids oscillation at resonator overtone modes. The circuit will force the resonator to operate at that frequency which produces a phase shift to complement the amplifier 180 degree overall phase shift. That is, the resonator will oscillate at a frequency that will produce a 180 degree phase shift from the input to block 11 to the juncture of resistor 14 and capacitor 15. Thus as V control at terminal 12 is varied, the oscillation frequency will change to compensate the change in phase shifter 11.

FIG. 2 shows the frequency versus phase shift of a typical mechanical resonator. The numbers relate to a commercially available ceramic resonator operating at about 500 kHz. The central crossover point represents the resonator series resonance frequency at which the current and voltage are in phase. As the frequency increases, the resonator appears inductive and a phase lag appears. As the frequency is lowered, a phase lead is present. However, as can be seen, the 45 degree phase lag is achieved by a frequency increment that is one half that required to produce an equal phase lead. In other words, the frequency versus phase characteristic is highly non-linear. Thus, the circuit of FIG. 1 may have a non-linear frequency versus V control unless the characteristics of transfer are modified to produce linearity.

FIG. 3 is a schematic diagram of a VCO as shown in FIG. 1 in which the frequency versus voltage characteristic has been linearized. The embodiment shown has been developed in monolithic integrated circuit (IC) form with the square symbols indicating IC chip pads. The circuit operates from a single power supply connected between +V at pad 20 and ground which is typically the IC substrate.

Pad 16 denotes the input to amplifier 10 of FIG. 1. Resistor 14 along with capacitor 15 are selected to produce a nearly 90 degree phase lag at the series resonance of resonator 13. Differential amplifiers 22 and 23 provide the gain function of amplifier 10 of FIG. 1. Differential amplifier 24 and transistors 25–27 provide the variable phase shifter 11 function of FIG. 1. The circuit operates as set forth below.

The signal at pad 16 is applied to one input of differential amplifier 22. Resistor 30 acts as an emitter current limiter. Constant voltage source 31 sets the base voltages of transistors 22a and 22b by way of resistors 32 and 33. Constant voltage source 34 sets the base voltage on transistors 23a and 23b by way of resistors 35 and 36 which also serve as collector load resistors for transistors 22a and 22b respectively. Current source 37 sets the current flowing in differential amplifier 23.

Pad 21, which couples to resonator 13, received two signals, one via differential amplifier 24 and one via differential amplifier 23. Resistors 38 and 39 control the signal addition at pad 21. Capacitor 40 is selected so that the signal voltage at the collector of transistor 23b lags that value that would be present without it. Pad 41 is present to permit capacitor 40 and resistor 39 to be external to the IC chip. The signal phase analysis is as follows.

Using pad 16 as a reference phase, the signal at the base of transistor 23b will be of the same phase (no inversion in differential amplifier 22). The collector of transistor 23b would ordinarily locate at 180 degrees. However, due to capacitor 40 the signal will actually locate at about 180-45 degrees or 135 degrees. The signal at the collector of transistor 23a is at zero degrees and this signal appears in the same phase at the collector of transistor 24b. However, this signal amplitude is variable due to the action of the control on differential amplifier 24. For the condition where transistors 24a and 24b are equally biased and conducted equally, the signal transfer is adjusted so that when the 135 degree signal from transistor 23b is added to the zero degree signal from transistor 24b, the resultant signal of pad 21 is at 90 degrees. It follows that if transistor 24a is turned full on and transistor 24b turned off, the phase on pad 21 will be at 135 degrees. If transistor 24a is turned off, and the signal passed by transistor 24b doubled, the resultant at pad 21 will be at 45 degrees. Thus between pads 16 and 21, the phase is nominally 90 degrees and the control via differential amplifier 24 gives a range of ±45 degrees to 135 or 45 degrees.

When the above-described 90 (nominal) phase lead is combined with a 90 degree phase lag produced by resistor 14 and capacitor 15, resonator 13 will oscillate at that frequency which will produce zero degrees phase shift. As the relative conduction between transistors 24a and 24b is varied, the resonator will shift frequency to produce a ±45 degree phase shift.

The function of the remainder of the current is to vary the relative conduction of transistors 24a and 24b in response to the potential of terminal 12 in such a way as to linearize the voltage to frequency transfer characteristic.

Transistors 25 and 26 are coupled as a differential pair to a current source 42. The base of transistor 26 is established at a fixed potential by constant voltage source 43. Dual emitter transistor 27 acts as an emitter load for transistors 25 and 26. The base of transistor 27 is held at a constant potential above that of transistor 26 by constant voltage source 44. Thus the collectors of transistors 25 and 26 will operate about one $V_{BE}$ below the level set by source 44 and the actual voltage will be a log response of the emitter load current. Since the bases of transistors 24a and 24b are directly coupled to the emitters of transistor 27, and since their current is exponentially related to base voltage, the relative conduction of transistors 24a and 24b will be linearly related to the collector currents in transitors 25 and 26.

Transistor 25 is shown having three emitters, each coupled through a resistor to a point on a voltage divider in common with transistor 26. Since each of the transistor 25 emitters is returned to a different potential, their conduction will be incremental. For the condition where V control is sufficiently more positive than the voltage produced by source 43, all of the current from source 42 will flow in the three emitters of transistor 25, which effectively operate in parallel. The apportionment of current in the three emitters will be established by the relative values of resistors 45-49. Due to the voltage drops across resistor 45 and 46, the lower emitter of transistor 25 will conduct more than the center emitter, which will conduct more than the upper emitter. As the potential at the base of transisistor is made less positive, the upper emitter will turn off, then the middle emitter will turn off and at still further potential lowering, the bottom emitter will turn off. For this condition all of the current will flow in transistor 26. For this condition transistor 24a will be off and 24b will be full on, giving a 45 degree phase shift between terminals 16 and 21.

Since the conduction of transistor 25 involves three separate emitters, its control will be non-linear, with the transfer slope being highest when all three emitters contribute. FIG. 4 is a graph showing the relationship between the $V_{control}$ potential and the signal contribution of transistor 24b at pad 21. At point 50 on the curve $V_{control}$ equals the potential across source 43. This is the condition where transistor 24b conducts equally with transistor 24a and a 90 degree phase shift exists. At point 51, transistor 25 is full on and transistor 26 off. Between points 50 and 52 on the curve, two of the three emitters of transistor 25 are conducting, and between points 52 and 53, only one emitter is conductive.

Clearly transistor 25 could be composed of three separate transistors having their bases and collectors paralleled. Also, it is clear that the entire circuit could be in discrete design. However, the circuit is well suited to IC construction and transistor 25 most readily constructed as a single device with multiple emitters.

As described, transistor 25 has three emitters and provides the transfer function of FIG. 4. If desired, only two emitters could be used to give a two slope transfer characteristic. Also, four or more emitters could be employed to give a four or more slope characteristic as desired.

EXAMPLE

The circuit of FIG. 3 was constructed in IC form using the following part values:

| Part | Designation |
|---|---|
| Resonator 13 | MuRata No. FX1028 |
| Resistor 14 | 620 ohms |
| Capacitor 15 | .001 mocrofarad |
| Resistor 30 | 500 ohms |
| Resistor 32 | 2.4K ohms |
| Resistor 33 | 2.4K ohms |
| Resistor 35 | 1K ohms |
| Resistor 36 | 1K ohms |
| Resistor 38 | 250 ohms |
| Resistor 39 | 2K ohms |
| Capacitor 40 | 130 picofarads |
| Resistor 45 | 500 ohms |
| Resistor 46 | 500 ohms |
| Resistor 47 | 2.5K ohms |

-continued

| Part | Designation |
|---|---|
| Resistor 48 | 3K ohms |
| Resistor 49 | 3K ohms |

Parts 13, 14, 15, 39, and 40 were exterior to the IC and all other were on chip elements. The resonator 13, normally operated at 503.5 kHz, which, when divided by 32, yields 15,734 Hz, which was used as a color television horizontal oscillator. The frequency varied in a substantially linear fashion over a range of ±500 Hz in response to a variable d.c. voltage applied to terminal 12.

The invention has been described and a working example given. It is clear that modifications and equivalents will occur to a person skilled in the art. Accordingly, it is intended that the scope of the invention be limited only by the following claims.

I claim:

1. A control circuit having a non-linear transfer characteristic as a function of an applied control potential, said circuit comprising:
    a differential amplifier stage having a differential control input, a common mode input, and an output; and
    a differential control stage having a differential output coupled to said control input of said differential amplifier stage, and a differential input, said differential control stage including a pair of transistors each constructed so as to have substantially different characteristics whereby the signal transfer characteristic from said common mode input to said differential amplifier stage output is a non-linear function of said potential applied to said input of said differential control stage.

2. The control circuit of claim 1 wherein one of said transistors is a plural emitter transistor and said circuit further includes means for controlling the flow of current in said emitters so that each emitter has a different threshold as a function of base potential.

3. The control circuit of claim 2 wherein the other transistor of said pair has a single emitter coupled through a resistor voltage divider to a current source and each emitter of said plural emitter transistor is coupled through a separate resistor to a separate point on said voltage divider.

4. The control circuit of claim 3 wherein said differential output of said differential control stage is coupled to an emitter load device, said emitter load device comprising:
    a dual emitter transistor and means for coupling an emitter to each side of said differential output.

* * * * *